United States Patent
Kono et al.

(10) Patent No.: US 8,873,330 B2
(45) Date of Patent: Oct. 28, 2014

(54) SEMICONDUCTOR MEMORY DEVICE

(75) Inventors: Fumihiro Kono, Yokohama (JP);
Kiyotaro Itagaki, Naka-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 316 days.

(21) Appl. No.: 13/417,503

(22) Filed: Mar. 12, 2012

(65) Prior Publication Data
US 2013/0077401 A1 Mar. 28, 2013

(30) Foreign Application Priority Data

Sep. 22, 2011 (JP) ................................. 2011-208162

(51) Int. Cl.
G11C 8/00 (2006.01)
G06F 13/16 (2006.01)
G11C 16/08 (2006.01)
G11C 16/04 (2006.01)

(52) U.S. Cl.
CPC ............ *G11C 16/08* (2013.01); *G06F 13/1694* (2013.01); *G11C 16/0483* (2013.01)
USPC ............ 365/230.04; 365/230.01; 365/230.05; 365/236

(58) Field of Classification Search
USPC ............................ 365/230.04, 230.01, 230.05
See application file for complete search history.

(56) References Cited

U.S. PATENT DOCUMENTS

2006/0028880 A1* 2/2006 Mikami et al. ............ 365/189.05

FOREIGN PATENT DOCUMENTS

JP 2000-66950 3/2000

OTHER PUBLICATIONS

U.S. Appl. No. 13/458,218, filed Apr. 27, 2012, Kono.

* cited by examiner

*Primary Examiner* — Han Yang
(74) *Attorney, Agent, or Firm* — Oblon, Spivak, McClelland, Maier & Neustadt, L.L.P.

(57) ABSTRACT

A plurality of address conversion circuits are provided for memory cores respectively, and convert logical address data supplied from outside to physical address data. In an interleave operation, the address conversion circuits output the logical address data as the physical address data without converting the logical address data when a first memory core is to be accessed earlier than a second memory core, whereas output address data obtained by adding a certain value to the logical address data as the physical address data when the second memory core is to be accessed earlier than the first memory core.

20 Claims, 7 Drawing Sheets

SEMICONDUCTOR MEMORY DEVICE

CROSS REFERENCE TO RELATED APPLICATIONS

This application is based on and claims the benefit of priority from prior Japanese Patent Application No. 2011-208162, filed on Sep. 22, 2011, the entire contents of which are incorporated herein by reference.

FIELD

Embodiments described herein relate generally to a semiconductor memory device.

BACKGROUND

Various types of memories are proposed as nonvolatile semiconductor memory devices for storing data in a memory cell in a nonvolatile manner. Among them, a NAND type flash memory is widely used as a data storage device because its memory capacity can be increased easily.

In order to further increase access speed, a NAND type flash memory capable of performing a so-called interleave operation is proposed. An interleave operation is an operation method in a NAND type flash memory having a plurality of memory cores. It executes an operation in one of the memory cores while executing another operation (for example, a precharge operation) in another of the memory cores, for example. This may conceal an operation in one memory core, and as a result increase the access speed as a whole.

DETAILED DESCRIPTION

A semiconductor memory device according to the embodiments to be described below includes a memory region including a plurality of memory cores. The memory region includes bit lines, word lines, and memory cells in each memory core. A row decoder selects a word line in the memory cores in accordance with an address signal. A column control circuit is configured to control input and output of data into the plurality of memory cells through the bit lines. A control circuit is configured to control the row decoder and the column control circuit. A plurality of address conversion circuits are provided for the memory cores respectively, and configured to convert logical address data supplied from outside to physical address data. The control circuit is configured to be capable of executing an interleave operation. The interleave operation alternately executes: while executing a first operation in a first memory core of the plurality of memory cores, a second operation in a second memory core different from the first memory core; and while executing the second operation in the first memory core, the first operation in the second memory core. The address conversion circuits is configured to output the logical address data as the physical address data without converting the logical address data when the first memory core is to be accessed earlier than the second memory core, whereas output address data obtained by adding a first value to the logical address data as the physical address data when the second memory core is to be accessed earlier than the first memory core.

Embodiments of a semiconductor memory device will now be explained with reference to the drawings.

First Embodiment

Figure 1:
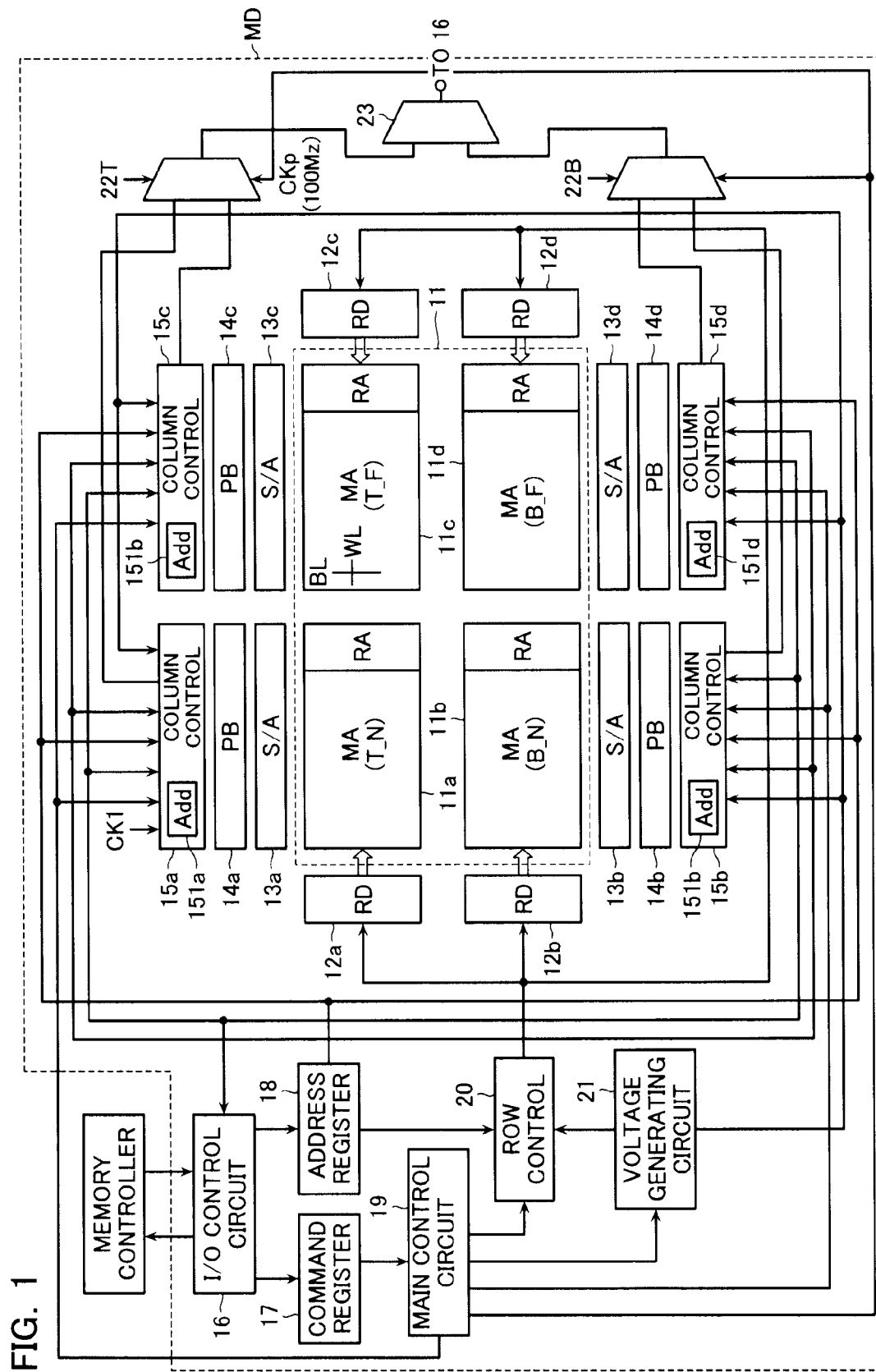
FIG. 1 is a block diagram showing a whole configuration of a semiconductor memory device according to a first embodiment.

First, a whole configuration of a semiconductor memory device according to the first embodiment will be explained with reference to FIG. 1. FIG. 1 is a block diagram of a semiconductor memory device according to the first embodiment of the present invention.

As shown in FIG. 1, the semiconductor memory device MD according to the first embodiment includes a memory region 11. The memory region 11 is configured by arranging a plurality of memory cores in a matrix. FIG. 1 shows an example in which four memory cores 11a to 11d are provided.

The semiconductor memory device also includes row decoders 12a to 12d, sense amplifier circuits 13a to 13d, page buffers 14a to 14d, column control circuits 15a to 15d, an input/output control circuit 16, a command register 17, an address register 18, a main control circuit 19, a row control circuit 20, a voltage generating circuit 21, and multiplexors 22T, 22B, and 23.

Figure 2:
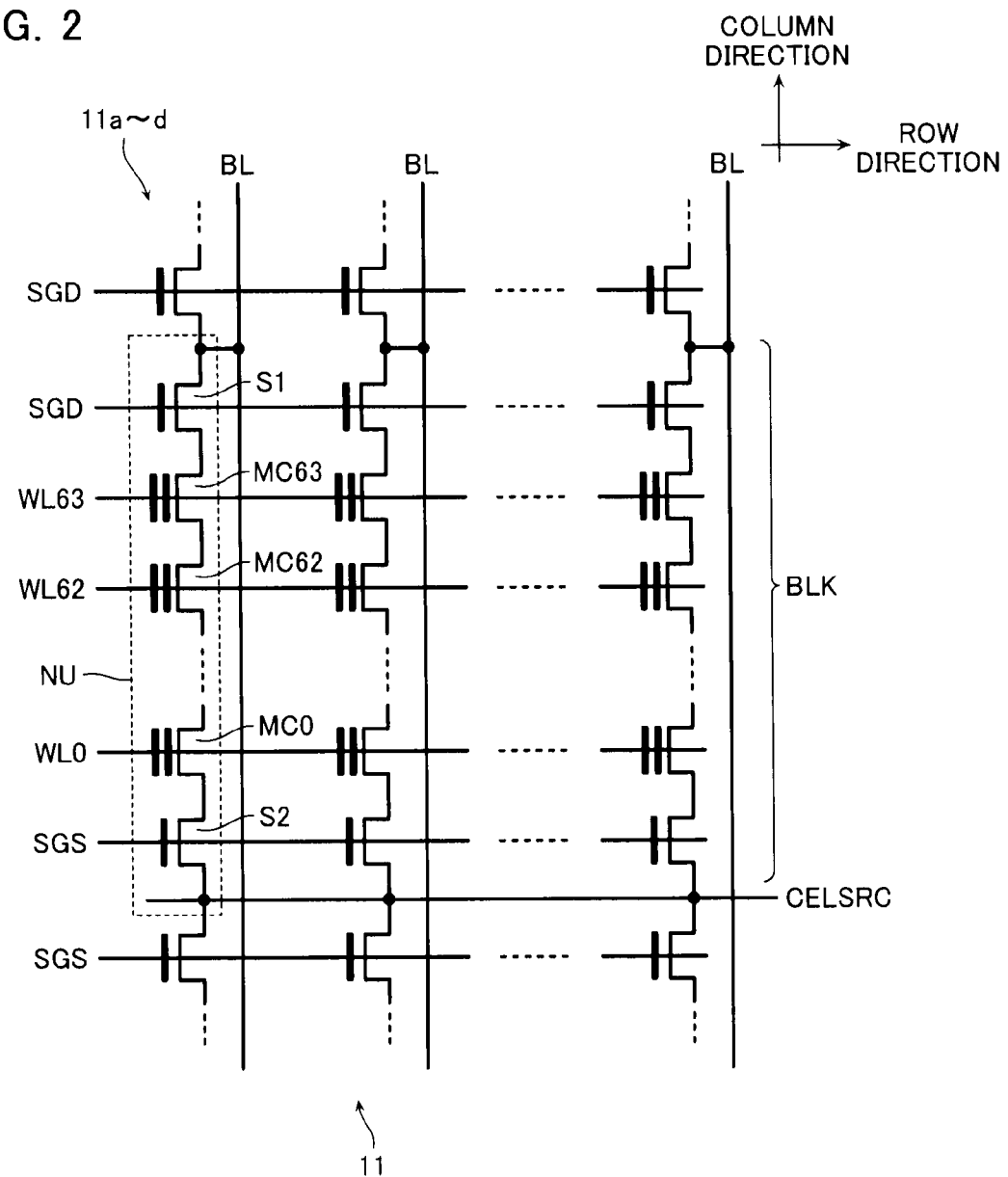
FIG. 2 is an equivalent circuit diagram showing a configuration of a memory cell array MA formed by memory cores 101a to 101d.

As shown in FIG. 2, each of the memory cores 11a to 11d in the memory region 11 includes a memory cell array MA configured by arranging NAND cell units NU in a row direction. Each NAND cell unit NU includes a plurality (64 in the example of FIG. 2) of electrically-rewritable nonvolatile memory cells MC0 to MC63 connected in series, and select gate transistors S1 and S2 for connecting both ends of the NAND cell unit NU to a bit line BL and a common source line CELSRC respectively.

Each memory cell MC has, for example, a stacked-gates configuration including a gate insulating film, a charge accumulation layer, an insulating film, and a control gate electrode which are stacked above a p-type well formed in a semiconductor substrate.

The control gates of the memory cells MC in a NAND cell unit NU are connected to different word lines WL0 to WL63. The gates of the select gate transistors S1 and S2 are connected to select gate lines SGD and SGS respectively. An aggregate of NAND cell units NU sharing one word line constitutes a block, which is a unit of data erasing. As shown in FIG. 2, a plurality of blocks BLK are arranged in the direction of bit lines. The bit lines BL are connected to the sense amplifier circuits 13a to 13d described later respectively. Memory cells MC connected commonly to one word line WL constitute one page.

In the following, the memory cell arrays MA of the memory cores 11a to 11d will be referred to as memory cell arrays MA(T_N), MA(B_N), MA(T_F), and MA(B_F) respectively. The symbol T or B means that it is a memory core at the top side or the bottom side of the memory region 11. The symbols N or F means that it is a memory core located near or far from the main control circuit 19. This allocation is one example, and arbitrary allocation is possible such as allocating Near side to the left side and Far side to the right side when the pad electrodes are located at a lower side.

A part of each of the memory cores 11a to 11d is set as an extra array RA for column redundancy (fault relief), for storing initial setting data, etc., and the like. In many cases, the number of bit lines BL included in the extra array RA is generally a number that is not a two's power. Hence, in the present embodiment, a lookup table to be described later is provided.

The row decoders 12a to 12d are provided correspondingly to the memory cores 11a to 11d respectively. The row decoders 12a to 12d decode an address signal, etc. input thereto through the row control circuit 20 and select a word line in the memory cores 11a to 11d respectively. The sense amplifier circuits 13a to 13d sense and amplify a signal read out through a bit line BL in the memory cores 11a to 11d and supply it to the page buffers 14a to 14d, whereas supplies a voltage corresponding to write data retained in the page buffers 14a to 14d to bit lines BL.

The page buffers 14a to 14d are provided correspondingly to the memory cores 11a to 11d respectively, and have functions of temporarily retaining data read out from the memory cores 11a to 11d in a reading operation, and temporarily retaining write data supplied from outside the chip in a writing operation.

The column control circuits 15a to 15d are provided correspondingly to the memory cores 11a to 11d respectively, and execute input/output control such as decoding a column address signal input thereto from the address register 18 to read out read data to the outside, supply write data to the page buffers 14a to 14d, etc. The column control circuits 15a to 15d include address conversion circuits 151a to 151d for converting address data (logical address data) supplied from the outside through the address register 18 to physical address data.

The input/output control circuit 16 transfers data input thereto from a memory controller or a host device (outside device) to the command register 17, the address register 18, or the column control circuits 15a to 15d in accordance with the type of the data, and transfers read data acquired by the column control circuits 15a to 15d to the outside. The address register 18, for example, is supplied with address data AIN from the input/output control circuit 16, and supplies it to the row control circuit 20 and the column control circuits 15a to 15d. The main control circuit 19 controls the row control circuit 20, the voltage generating circuit 21, and the column control circuits 15a to 15d based on command data sent from the command register 17.

The row control circuit 20 controls the row decoders 12a to 12d under the control of the main control circuit 19 based on row address data supplied from the address register 18. The voltage generating circuit 21 generates a voltage and clock signals for each type of operation under the control of the main control circuit 19 and supplies it to the row control circuit 20 and the column control circuits.

The multiplexors 22T and 22B operate when executing a reading operation based on an interleave operation. The multiplexor 22T has a function of organizing and outputting data to be read out alternately by an interleave operation from the memory cores 11a (MA(T_N)) and 11c (MA(T_F)). The multiplexor 22B has a function of organizing and outputting data to be read out alternately by an interleave operation from the memory cores 11b (MA(B_N)) and 11d (MA(B_F)). The multiplexor 23 has a function of further organizing the signals output from the multiplexors 22T and 22B and outputting them to the input/output control circuit 16. The multiplexors 22T and 22B operate in accordance with a clock signal CKp having, for example, 100 MHz. This frequency is twice as high as that of a clock signal CK1_BN, CK1_TN, CK1_BF, AND CK1_TF (50 MHz) used for the operations of the memory cores 11a to 11d.

Figure 3:
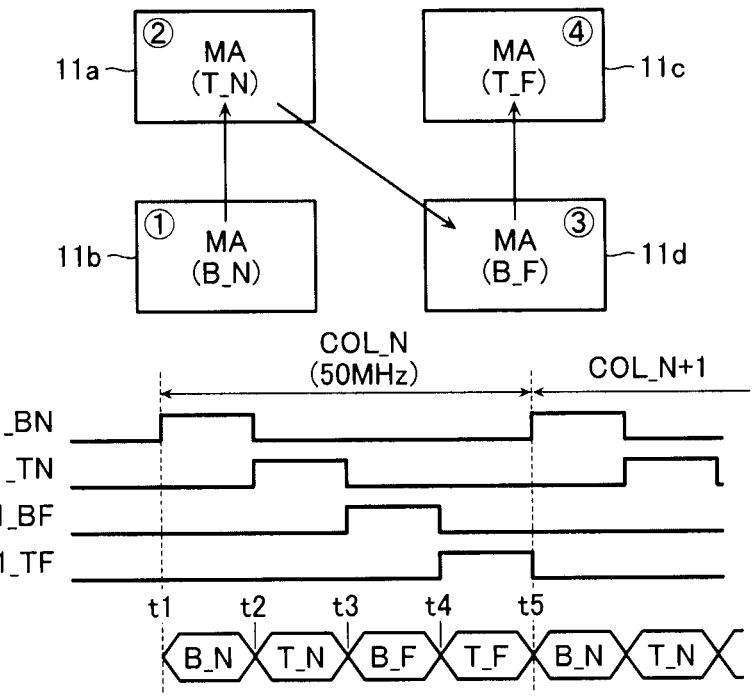
FIG. 3 explains an interleave operation.

An interleave operation will now be explained with reference to FIG. 3 and FIG. 4. An interleave operation is an operation of, for example, starting a second operation in a second memory core of the memory cores 11a to 11d while executing a first operation different from the second operation in a first memory core different from the second memory core, whereas starting the first operation in the second memory core while executing the second operation in the first memory core. For example, the main control circuit 19 supplies the clock signals CK1_TN, CK1_BN, CK1_TF, and CK1_BF which are different in timing from one another to the memory cores 11a to 11d. For example, as shown in FIG. 3, a pre-charge operation as a previous step for a reading operation is started in the memory core 11b (MA(B_N)) at a timing t1 at which a clock signal CK1_BN rises, and after this, a reading operation is started in the memory core 11b (MA(B_N)) at a timing t2 at which a clock signal CK1_TN rises, while also a pre-charge operation is started in another memory core 11a (MA(T_N)). In the same manner, a reading operation is executed sequentially in the memory cores 11b, 11a, 11d, and 11c while also a pre-charge operation is started in another memory core behind the reading operation. Such an interleave operation can conceal the pre-charge operation substantially and hence reduce the operation time substantially.

Figure 4:
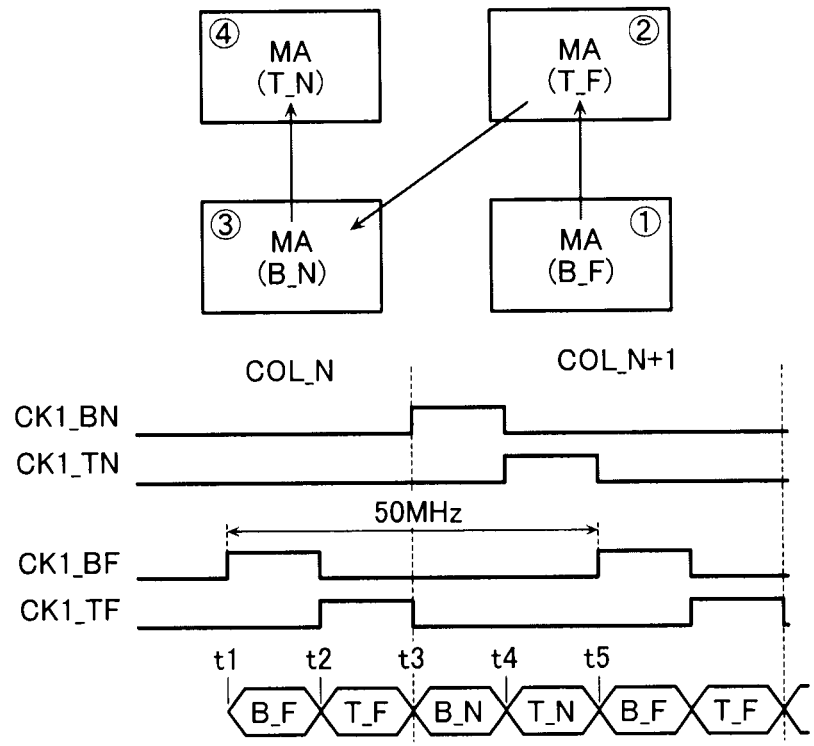
FIG. 4 explains an interleave operation.

However, as shown in FIG. 4, there is a case when there is issued an instruction for an interleave operation for conversely accessing the memory cores 11c and 11d at the Far side earlier and accessing the memory cores 11a and 11b at the Near side later. In this case, according to a conventional art, the column control circuits of the memory cores 11a and 11b to be accessed later generate one clock of dummy clock signal for incrementing address data, in order to count up the address data. Hence, even when an instruction for an interleave operation for accessing the memory cores at the Far side earlier is issued, the memory cores at the Near side can be accessed suitably. However, such a dummy clock signal hinders a high-speed operation. Furthermore, equipping the column control circuit with a count-up function based on such a dummy clock signal would complicate the configuration of the column control circuit and increase the circuit area.

Hence, in the present embodiment, the address conversion circuits 151a to 151d have the following configuration and function so as to be able to deal with both the cases when an instruction for an interleave operation for accessing the Near side earlier is issued and when an instruction for an interleave operation for accessing the Far side earlier is issued. With such address conversion circuits 151a to 151d, there is no need for any configuration and operation for generating such a dummy clock signal as described above, which is advantageous in that the circuit configuration can be simplified and the operation speed can be increased because the dummy clock signal becomes unnecessary.

Figure 5:
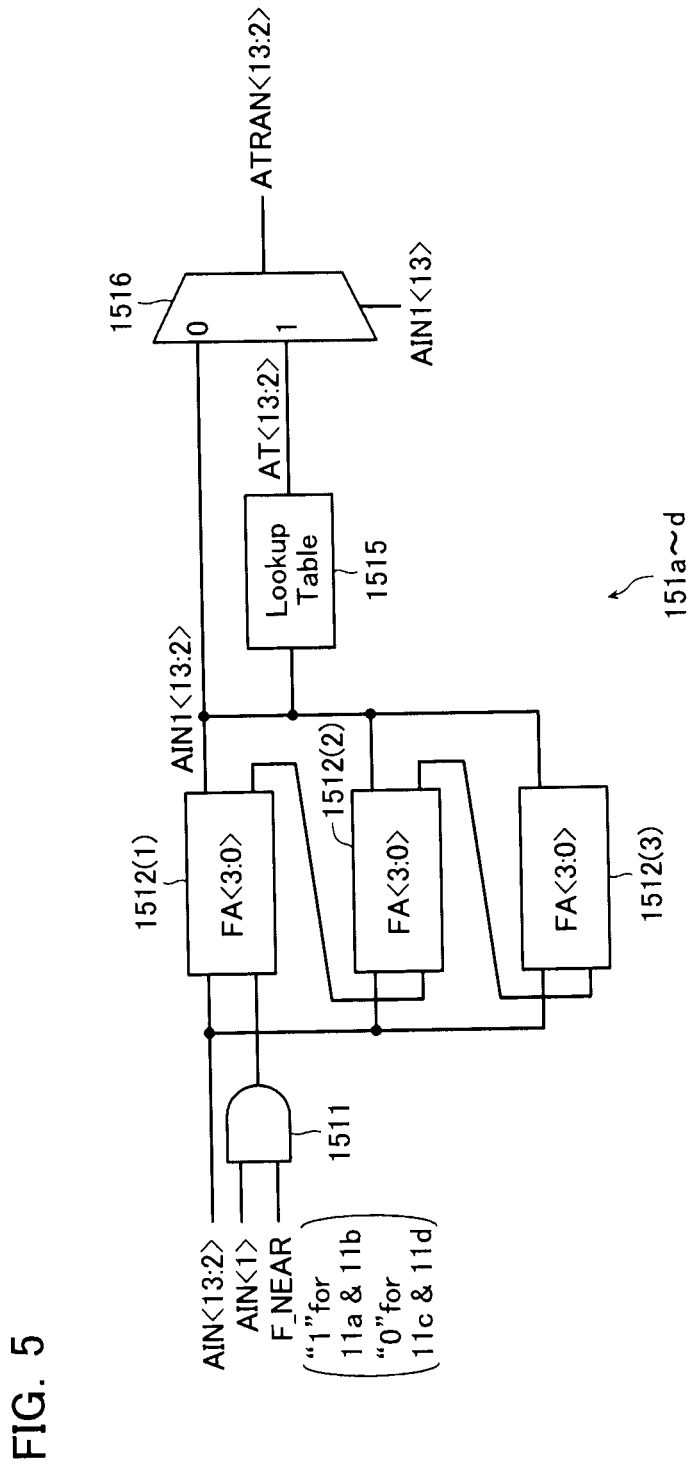
FIG. 5 is a circuit diagram showing a configuration of an address conversion circuit according to a first embodiment.

The configuration of the address conversion circuits 151a to 151d will be explained with reference to FIG. 5. In the present embodiment, address data AIN<13:2> is input into the column control circuits 15a to 15d as column address data. The first data AIN<0> is data for selecting either the Top side or the Bottom side of the memory cores 11a to 11d. The first data is not shown in FIG. 5, for better understanding. The second data AIN<1> is data for selecting either the Near side or the Far side of the memory cores 11a to 11d. The last data AIN<13> in the address data AIN<13:2> is data that designates whether or not to access the extra array RA.

The address conversion circuits 151a to 151d include a logical gate circuit 1511, a plurality of full adders 1512(1) to 1512(3), a lookup table 1515, and a multiplexor 1516.

The logical gate circuit 1511 (AND circuit) is supplied with address data AIN<1> and a position specifying signal F_NEAR as input signals, and outputs a logical AND of these two signals. The position specifying signal F_NEAR is a signal that becomes "1" when the corresponding one of the memory cores 11a to 11d is at the Near side, and becomes "0" when the corresponding one of the memory cores 11a to 11d is at the Far side. Namely, the position specifying signal F_NEAR to be supplied to each of the address conversion circuits 151a to 151d is fixed to either "1" or "0". In the case of FIG. 1, the position specifying signal F_NEAR of the address conversion circuits 151a and 151b is "1", and the position specifying signal F_NEAR of the address conversion circuits 151c and 151d is "0".

The plurality of full adders 1512(1) to 1512(3) are connected in series such that an output signal of an upstream full adder is input into a downstream full adder. In the example of FIG. 5, the full adders 1512(1) to 1512(3) take charge of calculation of the most significant four bits, the next most significant four bits, and the least significant four bits, respectively. An output signal of the logical gate circuit 1511 is input into the most upstream full adder 1512(1). The full adders 1512(1) to 1512(3) output an address signal AIN1<13:2>. That is, the full adders 1512(1) to 1512(3) output a result of adding the AND result of F_NEAR and AIN<1> to the lowest-order place of the address signal AIN<13:2>. The address signal AIN1<13:2> is identical with the address signal AIN<13:2> when the interleave operation is for accessing the Near side earlier as in FIG. 3. On the other hand, when the interleave operation is for accessing the Far side earlier as in FIG. 4, the address signal AIN1<13:2> has the value obtained by adding +1 to the address signal AIN<13:2>. The value +1 is an example of the value to be added, and may be replaced by another value.

The lookup table 1515 stores logical address data AIN1<13:2> and physical address data ATRAN<13:2> in one-to-one correspondence, and has a function of reading out physical address data ATRAN<13:2> corresponding to logical address data AIN1<13:2> input thereinto. The lookup table 1515 is provided for dealing with the extra array RA that is included in the memory cores 11a to 11d.

A normal memory cell array is designed so as to include a two's-power number of bit lines BL therein. However, the number of bit lines BL in the extra array RA is often not a two's power because it is decided based on the redundancy rate, etc. This is the reason the lookup table 1515 is provided. That is, the lookup table 1515 is provided for when the extra array RA is to be accessed, in order to convert address data for a two's-power number of bit lines BL to address data adapted to designate a not-two's-power number of bit lines BL included in the extra array RA.

The multiplexor 1516 selectively outputs either an address signal AT<13:2> obtained as a result of conversion by the lookup table 1515 or the address signal AIN1<13:2> before conversion in accordance with the address signal AIN1<13>. The address signal AIN1<13> is a signal that becomes "0" when the normal memory cell array MA in the memory cores 11a to 11d, is to be accessed and becomes "1" when the extra array RA is to be accessed. When the address signal AIN1<13> is "0", the address signal ATRAN<13:2> to be output is identical with the address signal AIN1<13:2>. When the address signal AIN1<13> is "1", the address signal ATRAN<13:2> to be output is identical with the address signal AT<13:2>.

Figure 6:
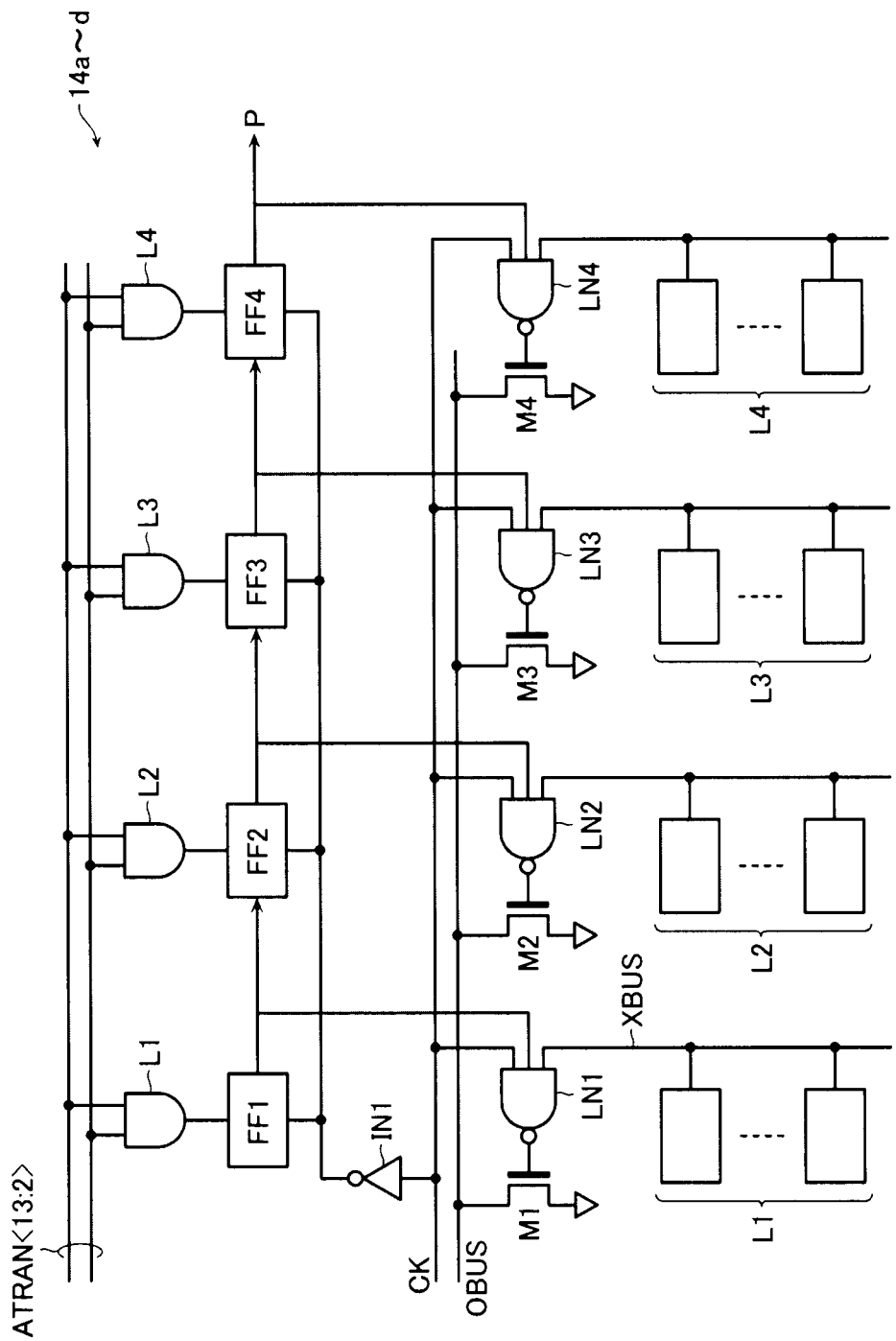
FIG. 6 is a circuit diagram showing an example of a circuit configuration of page buffers 14a to 14d.
Figure 7:
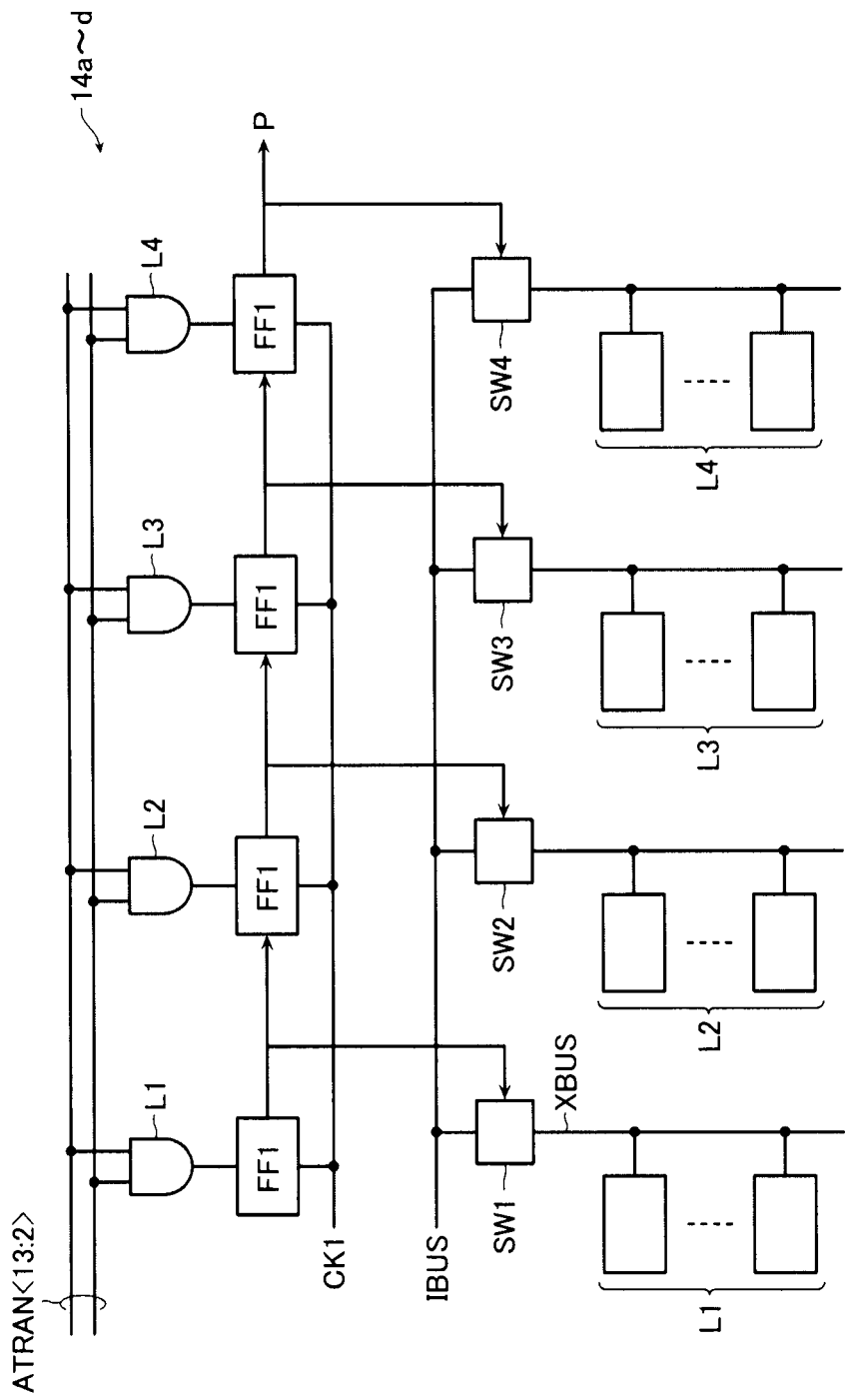
FIG. 7 is a circuit diagram showing an example of a circuit configuration of page buffers 14a to 14d.

The circuit configuration of the page buffers 14a to 14d will be explained with reference to FIG. 6 and FIG. 7. FIG. 6 shows the configuration of a circuit region that takes charge of data output of the page buffers 14a to 14d (i.e., a region that operates in a reading operation). FIG. 7 shows the configuration of a circuit region that takes charge of data input of the page buffers 14a to 14d (i.e., a region that operates in a writing operation).

As shown in FIG. 6, the page buffers 14a to 14d includes logical gate circuits L1 to L4, flip flops FF1 to FF4, transistors M1 to M4, logical gate circuits LN1 to LN4, an inverter IN1, and latch circuits L1 to L4 as the circuit configuration for taking charge of data output.

The logical gates L1 to L4 receive physical address data ATRAN<13:2> supplied from the address conversion circuits 151a to 151d, and in accordance with this output, set data in the flip flops FF1 to FF4. The flip flops FF1 to FF4 output a pointer P that points to the latch circuits L1 to L4 that should acquire data. The flip flops FF1 to FF4 transfer data to their succeeding flip flop in accordance with an output signal from the inverter INV1.

The pointer P is supplied to one of the input terminals of the logical gate circuits LN1 to LN4. In addition, the latch circuits L1 to L4 are connected to and a clock signal CK1 is supplied to the input terminals of the logical gate circuits LN1 to LN4. The output terminal of the logical gate circuits LN1 to LN4 is connected to the gate of the transistors M1 to M4. The transistors M1 to M4 form a current path between an output bus OBUS and a grounding terminal. The clock signal CK1 is inverted by the inverter INV1 to be used for the transferring operation of the flip flops FF1 to FF4.

Next, the data output operation of the page buffers 14a to 14d will be explained. In the data output operation, data is read out from the memory cores 11a to 11d through the sense amplifier circuits 13a to 13d, and then temporarily stored the latch circuits L1 to L4 of the page buffers 14a to 14d. When a physical address ATRAN<13:2> is input from the outside in this condition, a pointer P corresponding to this address is output. In accordance with this pointer P, data in the latch circuit L1 to L4 is output to the output bus OBUS through the logical gate circuit LN1 to LN4 and the transistor M1 to M4 while the clock signal CK1 is rising.

Next, the circuit configuration for taking charge of data input of the page buffers 14a to 14d will be explained with reference to FIG. 7. The page buffers 14a to 14d includes logical gate circuits L1 to L4, flip flops FF1 to FF4, switches SW1 to SW4, and latch circuits L1 to L4 as the circuit configuration for taking charge of data input. This circuit configuration is the same as shown in FIG. 6, except the switches SW1 to SW4.

Next, the data input operation of the page buffer circuits 14a to 14d will be explained. When a physical address ATRAN<13:2> is input from the outside, a pointer P corresponding to this address is output. In accordance with this pointer P, an input bus IBUS into which data is input and a bus XBUS are connected through the switches SW1 to SW4, and input data is hence written into any of the latch circuits L1 to L4. Every time the clock CK1 repeats rising and falling, the pointer position shifts, and data is acquired into the next latch circuits L1 to L4.

Next, the operation of the address conversion circuits 151a to 151d will be explained by employing separately a case when executing an interleave operation for accessing the Near side earlier (FIG. 3) and for a case when executing an interleave operation for accessing the Far side earlier (FIG. 4).

First, the operation of the address conversion circuits 151a to 151d for when executing an interleave operation for accessing the Near side earlier will be explained. In this case, the second data AIN<1> is set to "0". Hence, in any of the address conversion circuits 151a to 151d, the output signal (logical AND signal) of the logical gate circuit 1511 (FIG. 5) becomes "0". Therefore, in any of the address conversion circuits 151a to 151d, address data AIN<13:2> is output to the lookup table 1515 as it is without being changed. That is, as shown in FIG. 3, the memory cores at the NEAR and FAR sides are accessed from a column address COL_N that corresponds to the address data AIN<13:2>. The clock signals CK1_BN, CK1_TN, CK1_ BF, and CK1_TF sequentially rise in this order, thereby controlling access beginning with an access to a column address COL_N in the memory cores at NEAR and FAR sides.

Next, the operation of the address conversion circuits 151a to 151d for when executing an interleave operation for accessing the Far side earlier will be explained. In this case, the second data AIN<1> is set to "1". Hence, in the address conversion circuits 151a and 151b at the Near side, the output signal (logical AND signal) of the logical gate circuit 1511 becomes "1". Therefore, in the address conversion circuits 151a to 151b, the address data AIN<13:2> is output as address data AIN1<13:2> with +1 added. That is, as shown in FIG. 4, the memory cores at the FAR side are accessed from a column address COL_N that corresponds to the address data AIN<13:2>. Thereafter, the memory cores at the NEAR side are accessed from a column address COL_N+1 that corresponds to the address data AIN<13:2> added by +1. The clock signals CK1_BF and CK1_TF sequentially rise in this order, thereby controlling access beginning with an access to a column address COL_N in the memory cores at the FAR side. After that, the clock signals CK1_BN and CK1_TN sequentially rise in this order, thereby controlling access beginning with an access to a column address COL_N+1 in the memory cores at the NEAR side.

In this way, when executing an interleave operation for accessing the Near side earlier (FIG. 3), the address conversion circuits 151a and 151b provided correspondingly to the memory cores 11a and 11b at the Near side output the address data AIN<13:2> as address data AIN1<13:2> without changing the address data AIN<13:2>. On the other hand, when executing an interleave operation for accessing the Far side earlier (FIG. 4), the address data AIN<13:2> is output with +1 added. This switching makes it possible to deal with both of the cases when the interleave operation of FIG. 3 is selected and when that of FIG. 4 is selected. Furthermore, with such an operation, it is no longer necessary to provide a circuit for generating a dummy clock signal that has been employed in the conventional techniques. Hence, it is possible to reduce the circuit area of the column control circuits, etc. and hence the total circuit area. Besides, it is possible to increase the operation speed of the circuit.

Second Embodiment

Next, a semiconductor memory device according to the second embodiment will be explained with reference to FIG. 8. The whole configuration of the second embodiment is the same as that of the first embodiment. The second embodiment is also the same as the first embodiment in being capable of executing an interleave operation. The second embodiment is different from the first embodiment in the configuration of the address conversion circuits 151a to 151d.

Figure 8:
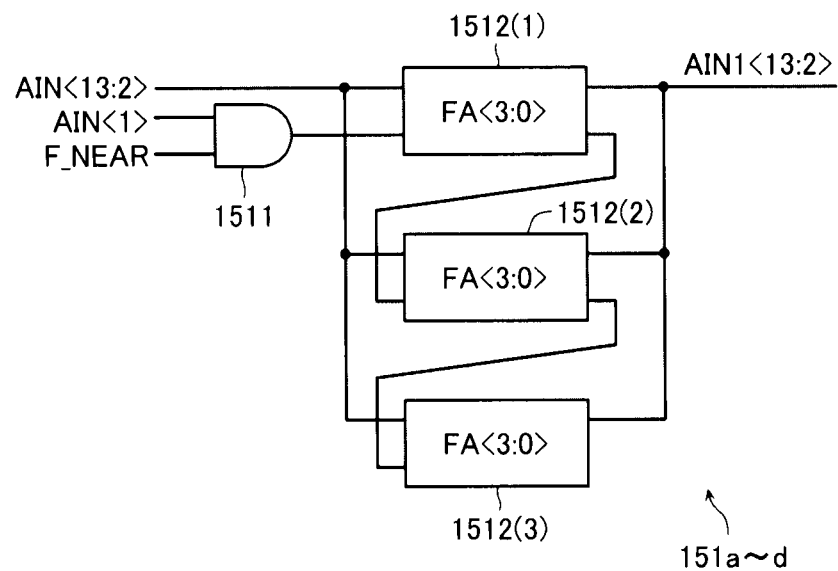
FIG. 8 is a circuit diagram showing a configuration of an address conversion circuit according to a second embodiment.

The second embodiment is different from the first embodiment in that no lookup table 1515 or multiplexor 1516 is provided, as shown in FIG. 8. In the present embodiment, address conversion is not executed even when the extra array RA is to be accessed, and hence address data AIN1<13:2> is supplied as it is to the page buffers 14a to 14d, etc.

As described above, it is often the case that the number of bit lines BL in the extra array RA is not a two's power. However, when the number of bit lines BL in the extra array RA is a two's power, address data AIN1<13:2> can be used as it is for designating an address in the extra array RA.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory region including a plurality of memory cores, the memory region including bit lines, word lines, and a plurality of memory cells in each of the memory cores;
a row decoder configured to select a word line of the memory cores in accordance with an address signal;
a column control circuit configured to control input and output of data into the plurality of memory cells through the bit lines;
a control circuit configured to control the row decoder and the column control circuit; and
a plurality of address conversion circuits provided for the memory cores respectively, and configured to convert logical address data supplied from outside to physical address data,
the control circuit being configured to be capable of executing an interleave operation, the interleave operation alternately executing: while executing a first operation in a first memory core of the plurality of memory cores, a second operation in a second memory core different from the first memory core; and while executing the second operation in the first memory core, the first operation in the second memory core,
the address conversion circuits being configured to output the physical address data corresponding to the logical address data without converting the logical address data when the first memory core is to be accessed earlier than the second memory core, whereas output address data obtained by adding a first value to the logical address data as the physical address data when the second memory core is to be accessed earlier than the first memory core.

2. The semiconductor memory device according to claim 1, further comprising a lookup table configured to convert the logical address data to the physical address data by adding a second value to the logical address data in accordance with a table storing data before address data conversion and corresponding data after address data conversion in one-to-one correspondence.

3. The semiconductor memory device according to claim 1, wherein each of the plurality of address conversion circuits determines whether or not to execute addition of the first value in accordance with first data designating either the first memory core or the second memory core and position data indicating a position at which the address conversion circuit is provided.

4. The semiconductor memory device according to claim 1, wherein each of the plurality of address conversion circuits includes:
a logical AND circuit configured to output a logical AND of first data designating either the first memory core or the second memory core and position data indicating a position at which the address conversion circuit is provided; and
a circuit configured to output a sum by receiving the logical AND and the logical address data as inputs.

5. The semiconductor memory device according to claim 1, further comprising a multiplexor configured to output data read out from the first memory core and data read out from the second memory core alternately in accordance with a clock signal.

6. The semiconductor memory device according to claim 2, wherein each of the plurality of address conversion circuits determines whether or not to execute addition of the first value in accordance with first data designating either the first memory core or the second memory core and position data indicating a position at which the address conversion circuit is provided.

7. The semiconductor memory device according to claim 2, wherein each of the plurality of address conversion circuits includes:
a logical AND circuit configured to output a logical AND of first data designating either the first memory core or the second memory core and position data indicating a position at which the address conversion circuit is provided; and
a circuit configured to output a sum by receiving the logical AND and the logical address data as inputs.

8. The semiconductor memory device according to claim 2, further comprising a multiplexor configured to output data read out from the first memory core and data read out from the second memory core alternately in accordance with a clock signal.

9. The semiconductor memory device according to claim 3, wherein each of the plurality of address conversion circuits includes:
a logical AND circuit configured to output a logical AND of first data designating either the first memory core or the second memory core and position data indicating a position at which the address conversion circuit is provided; and
a circuit configured to output a sum by receiving the logical AND and the logical address data as inputs.

10. The semiconductor memory device according to claim 3, further comprising a multiplexor configured to output data read out from the first memory core and data read out from the second memory core alternately in accordance with a clock signal.

11. The semiconductor memory device according to claim 1, wherein the first operation and the second operation are a reading operation of the memory cores and a pre-charge operation of the memory cores.

12. A semiconductor memory device, comprising:
a memory region including a plurality of memory cores, the memory region including bit lines, word lines, and a plurality of memory cells in each of the memory cores; and
a control circuit being configured to be capable of executing an interleave operation, the interleave operation alternately executing: while executing a first operation in a first memory core of the plurality of memory cores, a second operation in a second memory core different from the first memory core; and while executing the second operation in the first memory core, the first operation in the second memory core,
the control circuit being configured to output the physical address data corresponding to the logical address data in the case of a first access where the first memory core is to be accessed earlier than the second memory core, and
the control circuit being configured to output the physical address data obtained by adding a first value to the logical address data in the case of a second access where the second memory core is to be accessed earlier than the first memory core.

13. The semiconductor memory device according to claim 12,
wherein each of the memory cores includes an address conversion circuit, and
the address conversion circuit further includes a logical AND circuit, and a full adder configured to receive the output from the logical AND circuit and address data as inputs.

14. The semiconductor memory device according to claim 13, wherein the logical AND circuit receives data for selecting either the first memory core or the second memory core, and a signal for specifying a position of the first memory core or the second memory core.

15. The semiconductor memory device according to claim 12, wherein the control circuit supplies a first clock signal used for an operation of the first memory core, and a second clock signal used for an operation of the second memory core, and is different in timing from the first clock signal,
during the second access, the first clock signal rises after the second clock signal rises.

16. A method of controlling a semiconductor memory device,
the semiconductor memory device including a plurality of memory cores and being configured to be capable of executing an interleave operation, the interleave operation being an operation alternately executing: while executing a first operation in a first memory core of the plurality of memory cores, a second operation in a second memory core different from the first memory core; and while executing the second operation in the first memory core, the first operation in the second memory core,
the method comprising:
outputting logical address data as physical address data without converting the logical address data when the first memory core is to be accessed earlier than the second memory core; and
outputting address data obtained by adding a first value to the logical address data as physical address data when the second memory core is to be accessed earlier than the first memory core.

17. The method according to claim 16, comprising
converting the logical address data to the physical address data by adding a second value to the logical address data in accordance with a table storing data before address data conversion and corresponding data after address data conversion in one-to-one correspondence.

18. The method according to claim 16, comprising
determining whether or not to execute addition of the first value in accordance with first data designating either the first memory core or the second memory core and position data indicating a position at which a corresponding address conversion circuit is provided.

19. The method according to claim 16, comprising outputting data read out from the first memory core and data read out from the second memory core alternately in accordance with a clock signal.

20. The method according to claim 16,
wherein the first operation and the second operation are a reading operation of the memory cores and a pre-charge operation of the memory cores.

* * * * *